United States Patent [19]

Nakata

[11] Patent Number: 5,254,489
[45] Date of Patent: Oct. 19, 1993

[54] METHOD OF MANUFACTURING SEMICONDUCTOR DEVICE BY FORMING FIRST AND SECOND OXIDE FILMS BY USE OF NITRIDATION

[75] Inventor: Hidetoshi Nakata, Tokyo, Japan

[73] Assignee: NEC Corporation, Tokyo, Japan

[21] Appl. No.: 779,078

[22] Filed: Oct. 18, 1991

[30] Foreign Application Priority Data

Oct. 18, 1990 [JP] Japan .................................. 2-280393
Nov. 30, 1990 [JP] Japan .................................. 2-340916

[51] Int. Cl.⁵ .......................................... H01L 21/265
[52] U.S. Cl. ........................................ 437/40; 437/43; 148/DIG. 112; 148/DIG. 117
[58] Field of Search ................ 437/40, 41, 43, 241, 437/247, 979, 983; 148/DIG. 112, DIG. 114, DIG. 116, DIG. 117

[56] References Cited

U.S. PATENT DOCUMENTS

| | | | |
|---|---|---|---|
| 4,113,515 | 9/1978 | Kooi et al. | 148/DIG. 114 |
| 4,621,277 | 11/1986 | Ito et al. | 148/DIG. 112 |
| 4,651,406 | 3/1987 | Shimizu et al. | 437/43 |
| 4,971,923 | 11/1990 | Nakanishi | 437/69 |

FOREIGN PATENT DOCUMENTS 62-256476  11/1987  Japan .
8603621   6/1986  World Int. Prop. O. ........ 148/DIG. 114

Primary Examiner—Brian E. Hearn
Assistant Examiner—C. Chaudhari
Attorney, Agent, or Firm—Sughrue, Mion, Zinn, Macpeak & Seas

[57] ABSTRACT

According to this invention, there is provided a method of manufacturing a semiconductor device. An element region and an element isolation region are formed on a semiconductor substrate of a first conductivity type. A first oxide film prospectively serving as a gate insulating film is formed in the element region. Thermal oxidation is performed after annealing is performed in nitrogen or ammonia atmosphere to nitrify an entire surface of the first oxide film. A predetermined region of a nitrified first oxide film is removed, and a second oxide film prospectively serving as a gate insulating film is formed in the predetermined region using the nitrified first oxide film as a mask. A gate electrode constituted by a polysilicon film is formed on each of the nitrified first oxide film and the second oxide film.

13 Claims, 9 Drawing Sheets

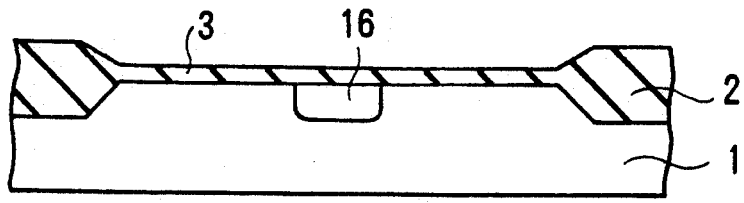
F I G. 5A
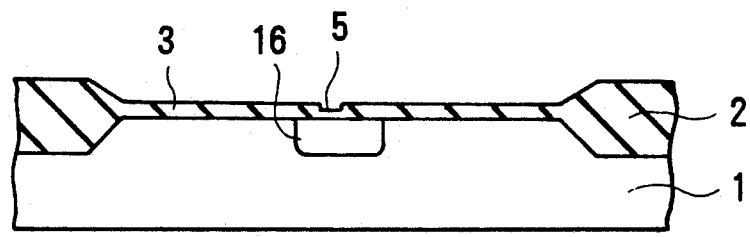
F I G. 5B
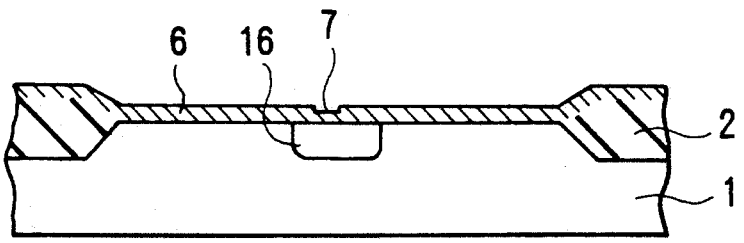
F I G. 5C
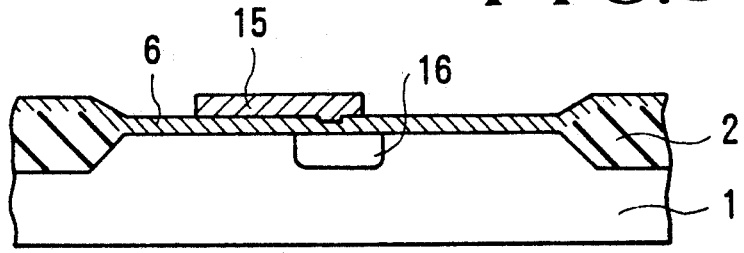
F I G. 5D
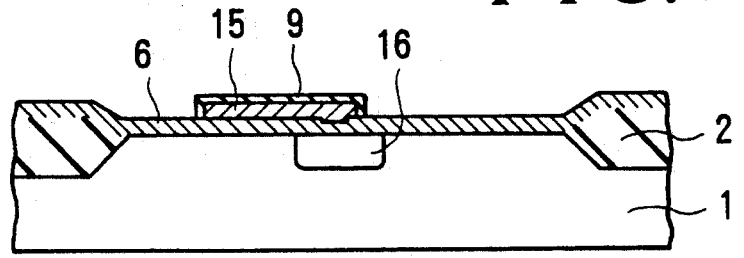
F I G. 5E

METHOD OF MANUFACTURING SEMICONDUCTOR DEVICE BY FORMING FIRST AND SECOND OXIDE FILMS BY USE OF NITRIDATION

BACKGROUND OF THE INVENTION

The present invention relates to a method of manufacturing a MOS semiconductor device and, more particularly, to a method of forming a gate insulating film.

A MOS semiconductor device has been developed to obtain a high integration density, high performance, and a large number of functions. MOS transistor characteristics have many various demands. For example, a demand for a MOS transistor (Japanese Patent Laid-Open No. 62-256476) having two types of gate oxide films having different thicknesses has been made as one of the many various demands.

A conventional method of manufacturing a MOS semiconductor device having two types of gate oxide films having different thicknesses is shown in FIGS. 2A to 2E. The conventional method will be described below with reference to FIGS. 2A to 2E. As shown in FIG. 2A, an element isolation region having an element isolation insulating film 2 and an element region having a first oxide film 3 are formed on a semiconductor substrate 1 of a first conductivity type. Subsequently, as shown in FIG. 2B, the first oxide film 3 is selectively etched using a photoresist 4 by, e.g., hydrofluoric acid. As shown in FIG. 2C, the photoresist 4 is removed, and a second oxide film 5 is formed by a thermal oxidation method. At this time, the thickness of the first oxide film 3 is increased to obtain a first oxide film 3a having a large thickness. Thereafter, as shown in FIG. 2D, a gate electrode 10 made of polysilicon is formed. As shown in FIG. 2E, diffusion layers 11 prospectively serving as a source and a drain are formed, and an insulating interlayer 12 is formed. Contact holes 12a are formed, wiring electrodes 13 are formed, and a covering insulating film 14 is formed as a protection film.

According to the conventional method of manufacturing a MOS semiconductor device, when the second oxide film is formed by a thermal oxidation method, the first oxide film is thermally oxidized, and the thickness of the first oxide film is increased to cause the following problems.

① The thickness of the first oxide film depends on the thickness of the second oxide film, and the thickness of the first oxide film cannot be independently set. That is, since the thickness of the first oxide film must have a predetermined thickness after the second oxide film is formed, the thickness of an oxide film previously formed must be adjusted in consideration of the thickness of the second oxide film. If the thickness of the second oxide film is to be changed, when the thickness of the oxide film previously formed is not changed, the thickness of the first oxide film is changed.

② Since the first oxide film is formed by two oxidation steps, variations in thicknesses of the films are larger than those of films formed by one oxidation step.

SUMMARY OF THE INVENTION

It is an object of the present invention to provide a method of manufacturing a semiconductor device in which the thickness of a first gate oxide film can be set independently of the thickness of a gate oxide film formed in a later thermal oxidation step.

It is another object of the present invention to provide a method of manufacturing a semiconductor device capable of decreasing variations in thickness of a gate oxide film.

In order to achieve the above objects of the present invention, there is provided a method of manufacturing a semiconductor device, comprising the steps of forming an element region and an element isolation region on a semiconductor substrate of a first conductivity type, forming a first oxide film prospectively serving as a gate insulating film in the element region, performing thermal oxidation after annealing is performed in a nitrogen or ammonia atmosphere to nitrify an entire surface of the first oxide film, removing a predetermined region of a nitrified first oxide film and forming a second oxide film prospectively serving as a gate insulating film in the predetermined region using the nitrified first oxide film as a mask, and forming a gate electrode constituted by a polysilicon film on each of the nitrified first oxide film and the second oxide film.

BRIEF DESCRIPTION OF THE DRAWINGS

FIGS. 5A to 5J are sectional views showing still another embodiment of the present invention.

DESCRIPTION OF THE PREFERRED EMBODIMENTS

Figure 1A:
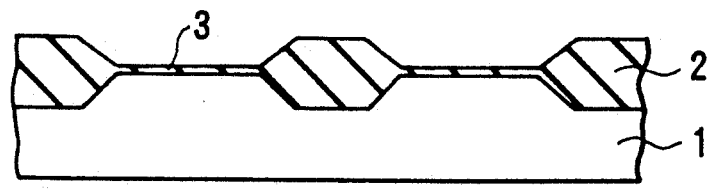
FIGS. 1A to 1F are sectional views showing an embodiment of the present invention.
Figure 1B:
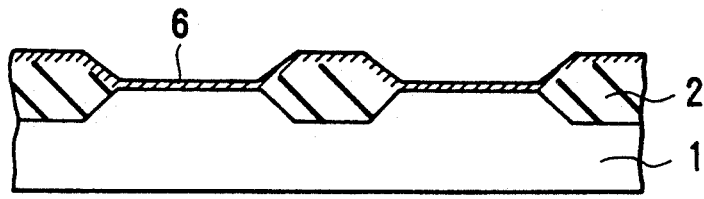
Figure 1C:
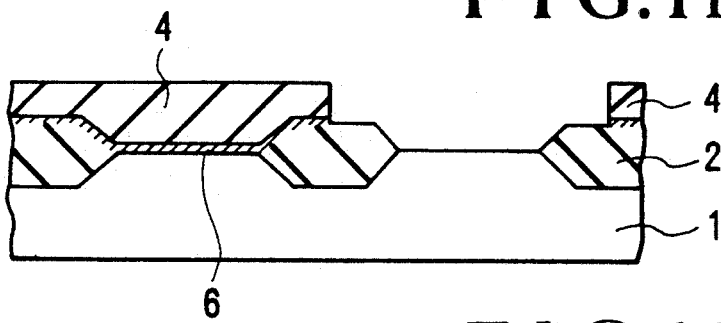
Figure 1D:
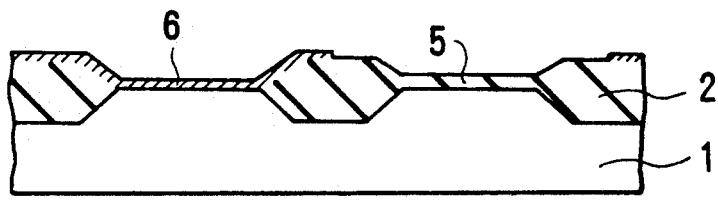
Figure 1E:
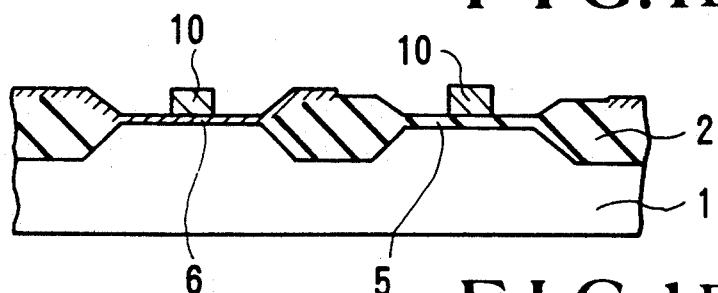

The present invention will be described below with reference to the accompanying drawings. FIGS. 1A to 1F are sectional views showing an embodiment of the present invention. First, an element isolation region having an element isolation insulating film 2 and an element region having a first oxide film 3 are formed on a semiconductor substrate 1 of a first conductivity type. As the first oxide film 3, a film is formed by thermal oxidation at a temperature of, e.g., 800° C. to 1,150° C., to have a thickness of about 100 Å to 500 Å (FIG. 1A). Subsequently, the entire surface of the first oxide film 3 is nitrified by annealing in a nitrogen gas atmosphere or an ammonia gas atmosphere. The nitrification is performed in the nitrogen gas atmosphere at a temperature of 1,000° C. to 1,200° C., and the nitrification is performed in the ammonia gas atmosphere at a temperature of 900° C. to 1,150° C. (FIG. 1B). A nitrified first oxide film 6 is selectively removed using a photoresist 4 by, e.g., hydrofluoric acid (FIG. 1C). A second oxide film 5 prospectively serving as a gate insulating film is formed by thermal oxidation at a temperature of, e.g., 800° C. to 1,150° C., to have a thickness of about 100 Å to 500 Å. At this time, the nitrified first oxide film 6 is rarely oxidized not to increase the thickness thereof (FIG. 1D). A gate electrode 10 constituted by a polysilicon film is formed (FIG. 1E). Diffusion layers 11 prospectively serving as a source and a drain are formed in predetermined regions of the semiconductor substrate 1 in relation to the gate electrode 10, and an insulating interlayer 12 is formed on the second oxide film 5 and the nitrified first oxide film 6 including the electrode 10.

Figure 1F:
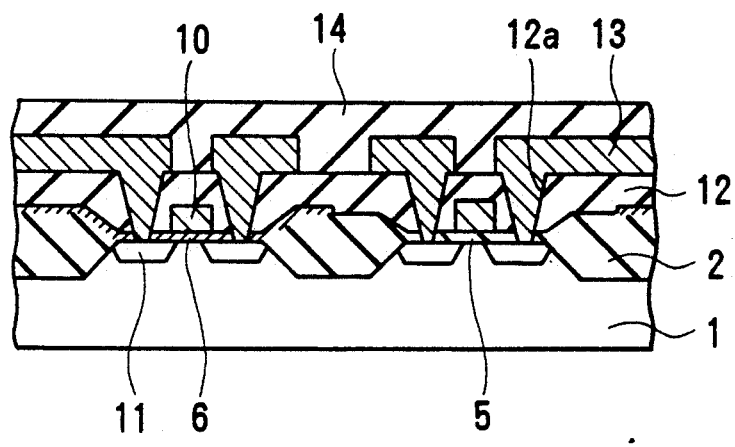
Figure 2A:
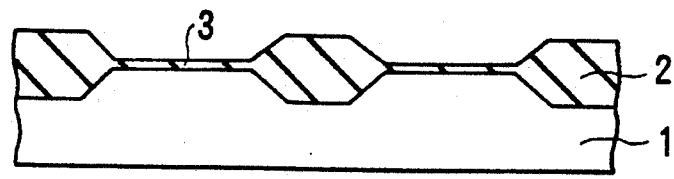
FIGS. 2A to 2E are sectional views showing a prior art.
Figure 2B:
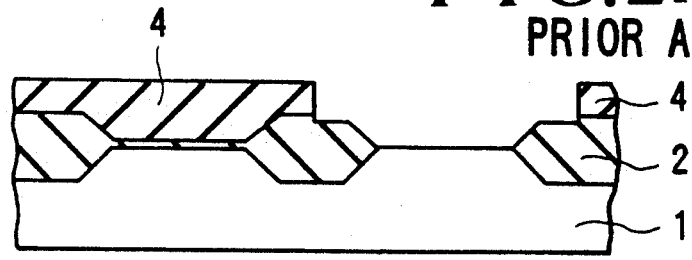
Figure 2C:
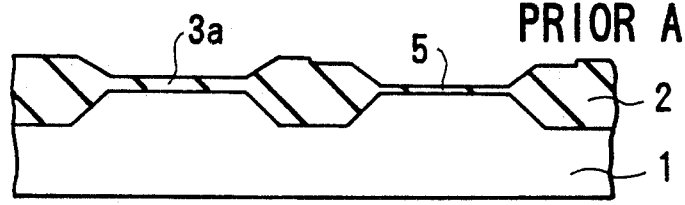
Figure 2D:
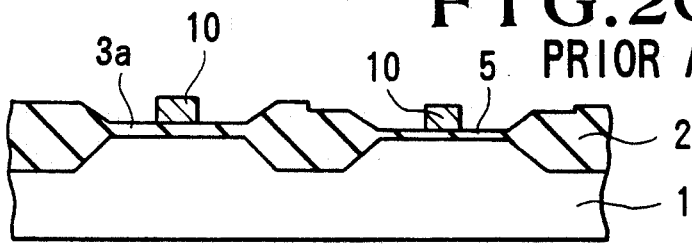
Figure 2E:
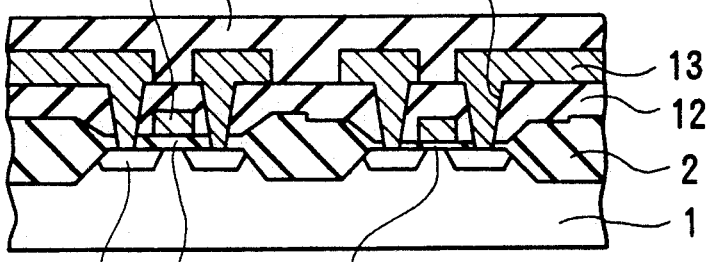

Contact holes 12a are formed in the insulating interlayer 12 on the diffusion layers 11, and wiring electrodes 13 are formed on the insulating interlayer 12. A covering insulating film 14 is formed as a protection film on the insulating interlayer 12 including the wiring electrodes 13 (FIG. 1F).

Figure 3A:
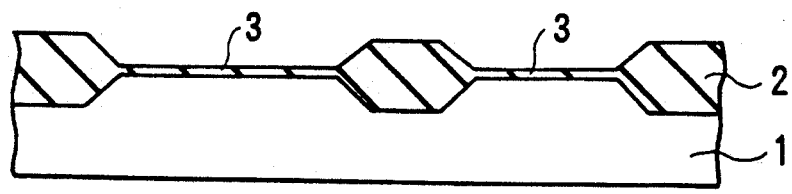
FIGS. 3A to 3H are sectional views showing another embodiment of the present invention.
Figure 3B:
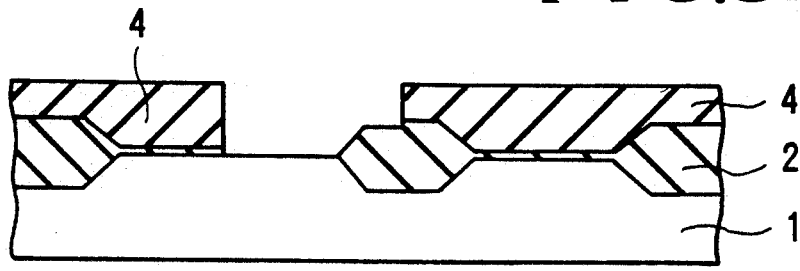
Figure 3C:
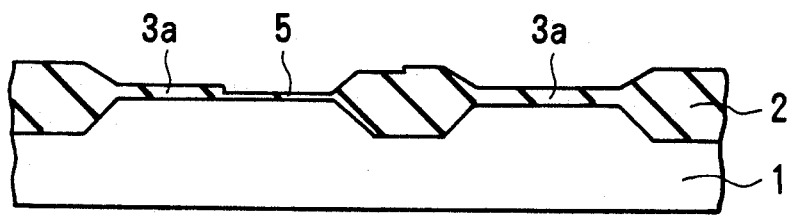
Figure 3D:
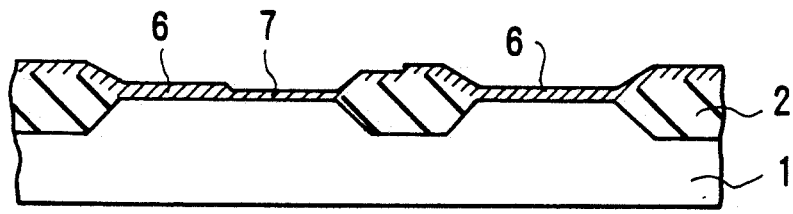
Figure 3E:
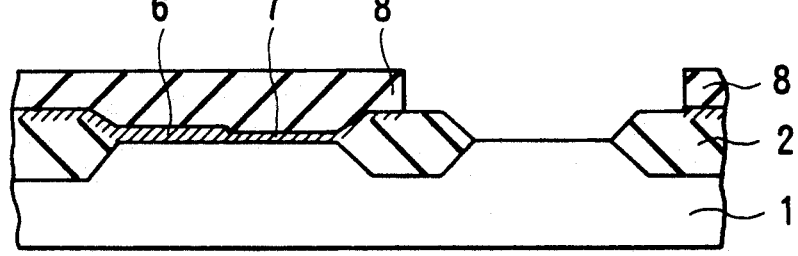
Figure 3F:
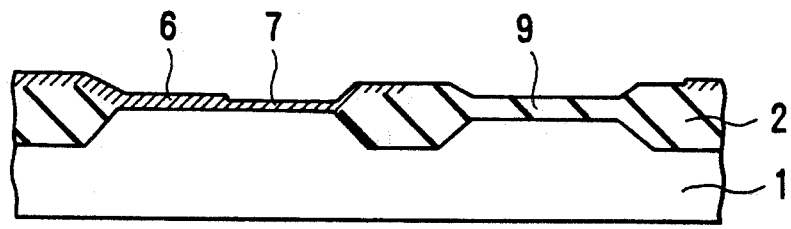
Figure 3G:
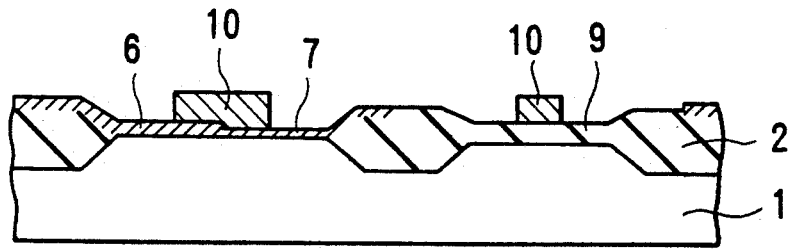
Figure 3H:
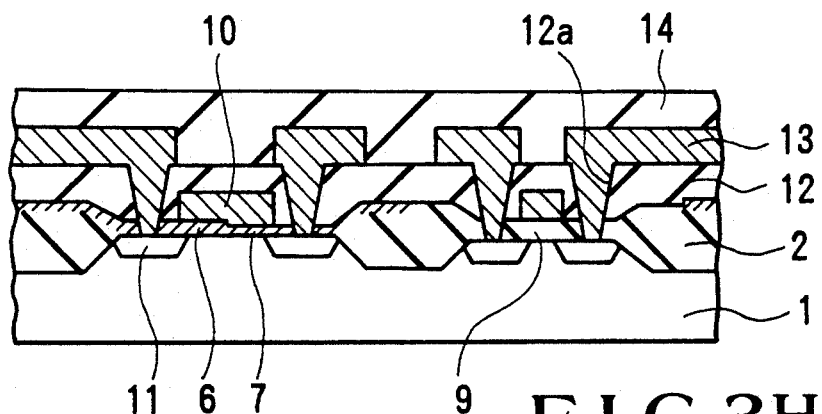

Sectional views of another embodiment of the present invention are shown in FIGS. 3A to 3H. An element isolation region having an element isolation insulating film 2 and an element region having a first oxide film 3 are formed on a semiconductor substrate 1 of a first conductivity type. As the first oxide film 3, a film is formed by thermal oxidation at a temperature of, e.g., 800° C. to 1,150° C., to have a thickness of about 100 Å to 400 Å (FIG. 3A). Subsequently, the first oxide film 3 is selectively etched by, e.g., hydrofluoric acid using a photoresist 4 (FIG. 3B). After the photoresist 4 is removed, a second oxide film 5 prospectively serving as a gate oxide film is formed by thermal oxidation at a temperature of, e.g., 800° C. to 1,150° C. to have a thickness of about 50 Å to 200 Å. At this time, the first oxide film 3 is oxidized to increase the thickness thereof, thereby obtaining a first oxide film 3a having a large thickness (FIG. 3C). After two types of oxide films, i.e., the first oxide film 3a having the large thickness and the second oxide film 5 are formed in the element region, the entire surface of the resultant structure is nitrified by annealing the resultant structure in a nitrogen gas atmosphere or an ammonia gas atmosphere. The nitrification is performed in the nitrogen gas atmosphere at a temperature of 1,000° C. to 1,200° C., and the nitrification is performed in the ammonia gas atmosphere at a temperature of 900° C. to 1,150° C. Thermal oxidation is performed at a temperature of, e.g., 800° C. to 1,150° C. to uniform the properties of the first and second oxide films (FIG. 3D). A nitrified first oxide film 6 is selectively removed by, e.g., hydrofluoric acid, using a photoresist 8 (FIG. 3E). A third oxide film 9 prospectively serving as a gate oxide film is formed by thermal oxidation at a temperature of, e.g., 800° C. to 1,150° C., to have a thickness of about 100 Å to 500 Å. At this time, the nitrified first oxide film 6 and a nitrified second oxide film 7 are rarely oxidized not to increase the thicknesses thereof (FIG. 3F). A gate electrode 10 constituted by a polysilicon film is formed (FIG. 3G), and diffusion layers 11 prospectively serving as a source and a drain are formed. An insulating interlayer 12 is formed, contact holes 12a are formed, and wiring electrodes 13 are formed. A covering insulating film 14 is formed as a protection film (FIG. 3H).

In this embodiment, a MOS transistor having a first gate insulating film in which the nitrified first oxide film 6 and the nitrified second oxide film 7 forms a step difference is formed. However, when these nitrified oxide films are respectively formed in different element regions, three types of MOS transistors having different gate insulating films can be integrated on the same silicon substrate.

As described above, a plurality of MOS transistors can be manufactured by appropriately combining formation of an oxide film, nitrification, and etching. In addition, the thicknesses of the gate insulating films of these MOS transistors can be independently set.

Figure 4A:
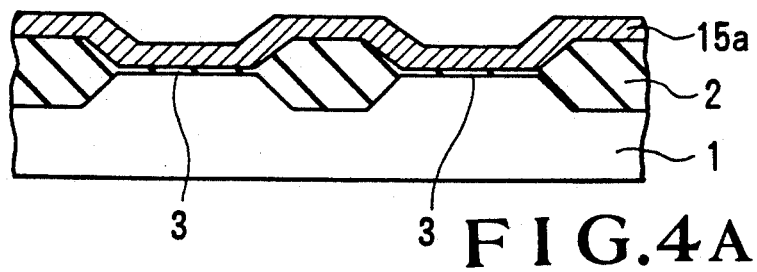
FIGS. 4A to 4I are sectional views showing still another embodiment of the present invention.
Figure 4B:
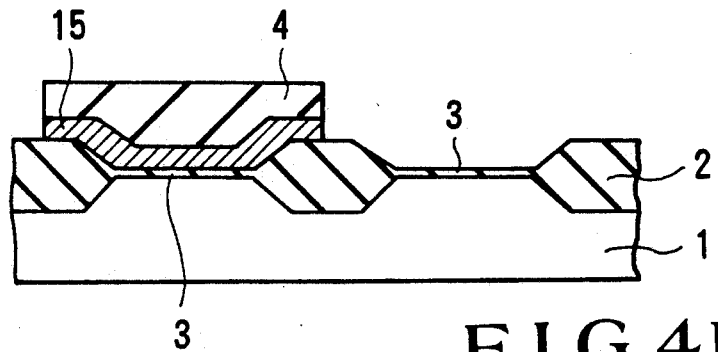
Figure 4C:
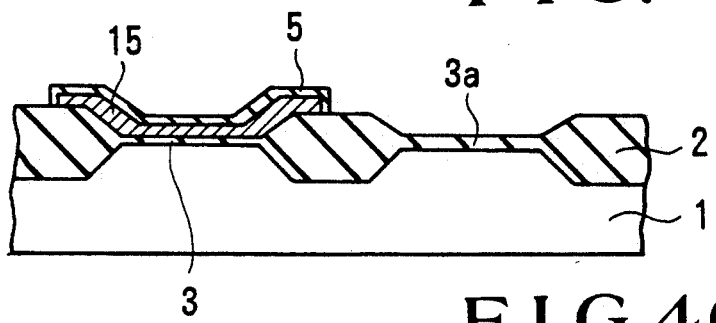

Sectional views according to still another embodiment of the present invention are shown in FIGS. 4A to 4I. First, an element isolation region having an element isolation insulating film 2 and an element region having a first oxide film 3 are formed on a semiconductor substrate 1 of a first conductivity type. As the first oxide film 3, a film is formed by thermal oxidation at a temperature of, e.g., 800° C. to 1,150° C., to have a thickness of about 100 Å to 400 Å. A first polysilicon film 15a containing an impurity, e.g., phosphorus, is formed on the entire surface of the resultant structure (FIG. 4A). Subsequently, a floating gate electrode 15 is selectively formed using a photoresist 4 (FIG. 4B). After the photoresist 4 is removed, a second oxide film 5 is formed by thermal oxidation at a temperature of, e.g., 800° C. to 1,150° C., to have a thickness of about 50 Å to 200 Å. At this time, the first oxide film 3 in a region covered with the floating gate electrode 15 is oxidized to increase the thickness of the first oxide film 3, thereby obtaining a first oxide film 3a having a large thickness (FIG. 4C).

Figure 4D:
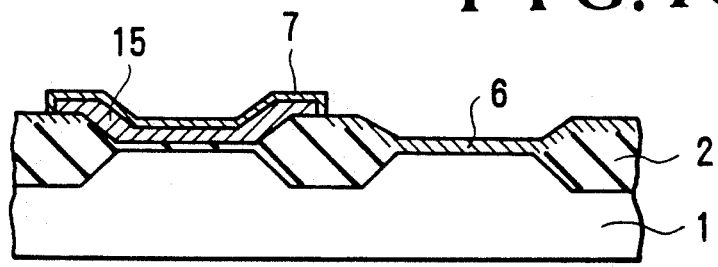
Figure 4E:
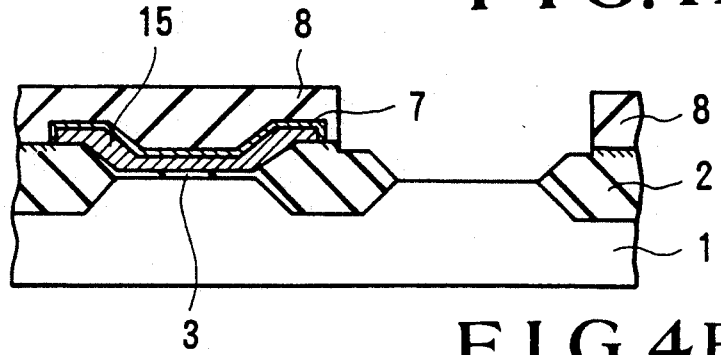
Figure 4F:
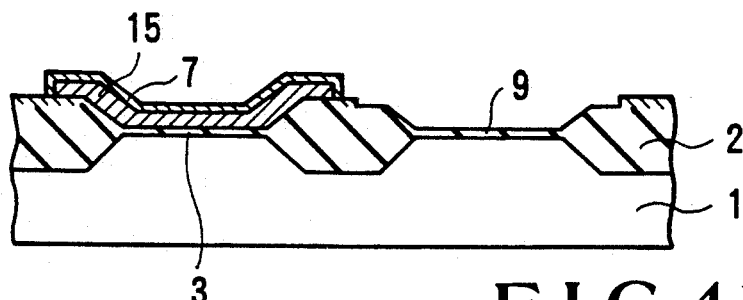
Figure 4G:
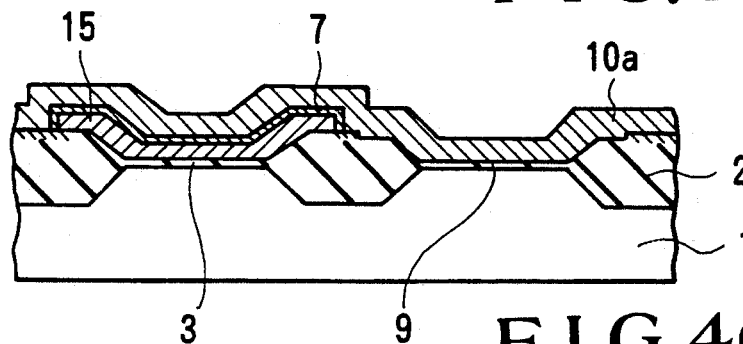
Figure 4H:
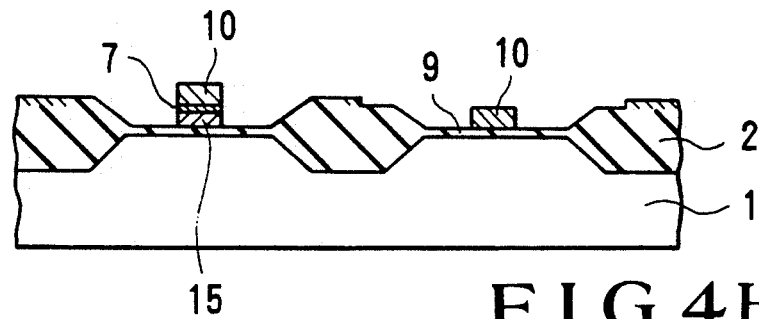
Figure 4I:
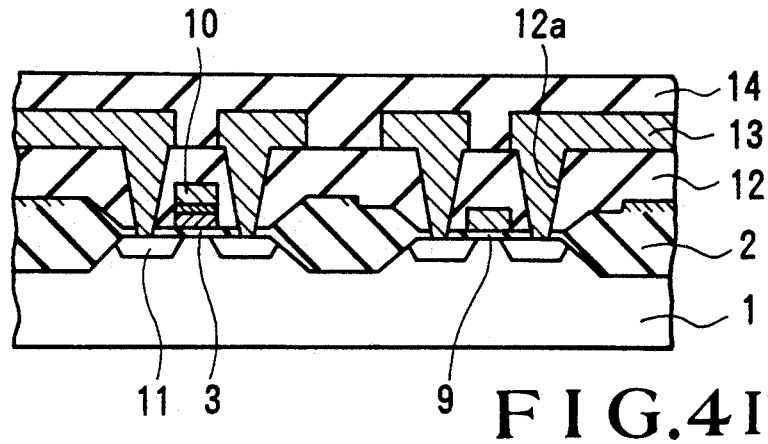

As described above, after the second oxide film 5 is formed on the floating gate electrode 15, the entire surface of the resultant structure is nitrified by annealing in a nitrogen gas atmosphere or an ammonia gas atmosphere. After two types of oxide films, i.e., the first oxide film 3a having the large thickness and the second oxide film 5 are formed in the element region, the entire surface of the resultant structure is nitrified by annealing in a nitrogen gas atmosphere or an ammonia gas atmosphere. The nitrification is performed in the nitrogen gas atmosphere at a temperature of 1,000° C. to 1,200° C., and the nitrification is performed in the ammonia gas atmosphere at a temperature of 900° C. to 1,150° C. lower than that in the nitrogen gas atmosphere, because reactivity is higher in the ammonia gas atmosphere than in the nitrogen gas atmosphere. Thereafter, thermal oxidation is performed at a temperature of, e.g., 800° C. to 1,150° C., to uniform the properties of the nitrified oxide films (FIG. 4D). A nitrified first oxide film 6 is selectively removed by, e.g., hydrofluoric acid, using a photoresist 8 (FIG. 4E). A third oxide film 9 prospectively serving as a gate oxide film is formed by thermal oxidation at a temperature of, e.g., 800° C. to 1,150° C., to have a thickness of about 100 Å to 500 Å. At this time, the nitrified second oxide film 7 is rarely oxidized not to increase the thickness thereof (FIG. 4F). A second polysilicon film 10a containing an impurity, e.g., phosphorus, is formed (FIG. 4G), and a gate electrode 10 is formed using a known photolithographic technique (FIG. 4H). Diffusion layers 11 prospectively serving as a source and a drain are formed, and an insulating interlayer 12 is formed. Contact holes 12a are formed, and wiring electrodes 13 are formed. A covering insulating film 14 is formed as a protection film (FIG. 4I).

Figure 5F:
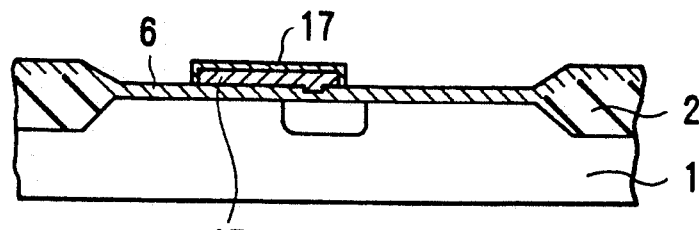
Figure 5G:
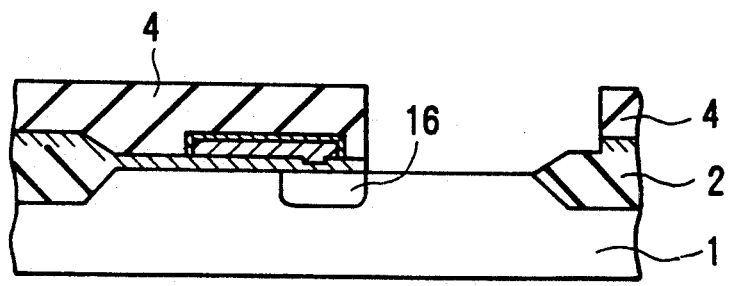
Figure 5H:
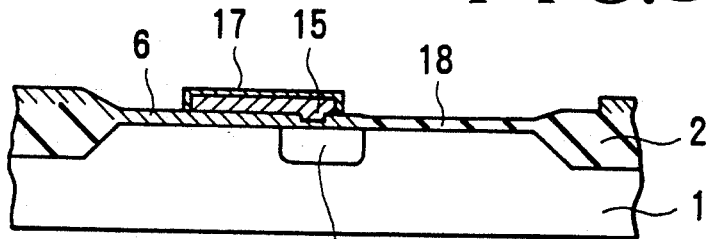
Figure 5I:
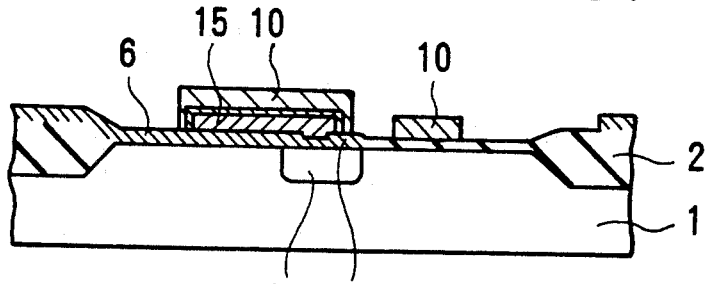
Figure 5J:
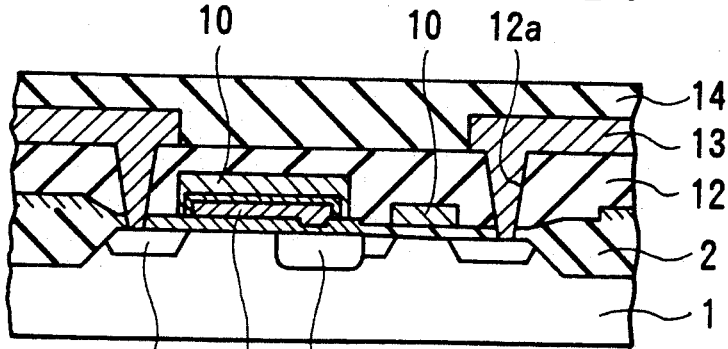

Sectional views according to still another embodiment of the present invention are shown in FIGS. 5A to 5J. First, an element isolation region having an element isolation insulating film 2 and an element region having a first oxide film 3 are formed on a semiconductor substrate 1 of a first conductivity type. An impurity having a conductivity type opposite to the first conductivity type of the semiconductor substrate 1 is doped in a predetermined region of the element region by an ion implantation method. The resultant structure is annealed at a temperature of, e.g., 800° C. to 1,150° C., to form a write diffusion layer 16. For example, when a p-type semiconductor substrate is used as the semiconductor substrate 1 of the first conductivity type, phosphorus or arsenic is used as the impurity (FIG. 5A). Subsequently, a part of the first oxide film 3 on the write diffusion layer 16 is etched using a known photoetching technique by, e.g., hydrofluoric acid, to expose the surface of the write diffusion layer 16, and a second oxide film 5 prospectively serving as a gate insulating film is formed by thermal oxidation at a temperature of, e.g., 700° C. to 1,100° C., to have a thickness of about 50 Å to 150 Å (FIG. 5B). Thereafter, annealing is performed in a nitrogen gas atmosphere or an ammonia gas atmosphere to nitrify the entire surface of the second oxide film 5. The nitrification is performed in the nitrogen gas atmosphere at a temperature of 1,000° C. to 1,200° C., and the nitrification is performed in the ammonia gas atmosphere at a temperature of 900° C. to 1,150° C. lower than that in the nitrogen gas atmosphere, because reactivity is higher in the ammonia gas atmosphere than in the nitrogen gas atmosphere. Thereafter, thermal oxidation is performed at a temperature of, e.g., 800° C. to 1,150° C. to uniform the properties of the nitrified oxide films (FIG. 5C). A floating gate electrode 15 constituted by a polysilicon film containing an impurity, e.g., phosphorus, is formed in a predetermined region (FIG. 5D). A third oxide film 9 is formed by thermal oxidation at a temperature of, e.g., 800° C. to 1,150° C., to have a thickness of about 50 Å to 200 Å. At this time, since the first oxide film 3 on the element region becomes the nitrified first oxide film 6 by nitrification, an increase in thickness of the nitrified first oxide film 6 caused by the thermal oxidation does not occur (FIG. 5E). The entire surface of the resultant structure is annealed in a nitrogen gas atmosphere or an ammonia gas atmosphere again to perform nitrification, and thermal oxidation is performed. At this time, the nitrification is performed in the nitrogen gas atmosphere at a temperature of 1,000° C. to 1,200° C., and the nitrification is performed in the ammonia gas atmosphere at a temperature of 900° C. to 1,150° C. The thermal oxidation is performed at a temperature of 800° C. to 1,150° C. (FIG. 5F). The nitrified first oxide film 6 is selectively removed by, e.g., hydrofluoric acid, using a photoresist 4 (FIG. 5G). A fourth oxide film 18 is formed by thermal oxidation at a temperature of, e.g., 800° C. to 1,150° C., to have a thickness of about 100 Å to 500 Å. At this time, a nitrified third oxide film 17 is rarely oxidized not to increase the thickness thereof (FIG. 5H). A gate electrode 10 is formed by a second polysilicon film containing an impurity, e.g., phosphorus (FIG. 5I), and diffusion layers 11 prospectively serving as a source and a drain are formed. An insulating interlayer 12 is formed, and contact holes 12a are formed. Wiring electrodes 13 are formed, and a covering insulating film 14 is formed as a protection film (FIG. 5J).

As described above, according to the present invention, the following advantages can be obtained. After a gate oxide film is formed, thermal oxidation is performed in a nitrogen gas atmosphere or an ammonia gas atmosphere to nitrify the gate oxide film. Therefore, since the gate oxide film has oxidation resistance, the thickness of the gate oxide film is not increased even when sequential thermal oxidation is performed to the gate oxide film. For this reason, the thickness of the first gate oxide film can be set independently of a gate oxide film formed by the sequential thermal oxidation. Since a gate oxide film which is formed by two oxidation steps in a conventional method can be formed in one oxidation step, variations in thicknesses of the gate oxide films can be suppressed to be small.

What is claimed is:

1. A method of manufacturing a semiconductor device, comprising the steps of:

forming an element region and an element isolation region on a semiconductor substrate of a first conductivity type;

forming a first oxide film prospectively serving as a gate insulating film in said element region;

annealing in a nitrogen or ammonia atmosphere to nitrify an entire surface of said first oxide film;

performing thermal oxidation of said nitrified first oxide film;

removing a portion of said nitrified first oxide film forming a second oxide film prospectively serving as a gate insulating film in the removed portion using said nitrified first oxide film as a mask; and forming a gate electrode constituted by a polysilicon film on each of said nitrified first oxide film and said second oxide film.

2. A method according to claim 1, wherein said first and second oxide films are formed by a thermal oxidation method.

3. A method according to claim 1, wherein the removed portion of said nitrified first oxide film is removed by a photoetching technique.

4. A method of manufacturing a semiconductor device, comprising the steps of:

forming an element region and an element isolation region on a semiconductor substrate of a first conductivity type;

forming a first oxide film prospectively serving as a gate insulating film in said element region;

performing thermal oxidation after annealing is performed in a nitrogen or ammonia atmosphere to nitrify an entire surface of said first oxide film;

removing a portion of said nitrified first oxide film and forming a second oxide film prospectively serving as a gate insulating film in the removed portion using said nitrified first oxide film as a mask;

forming a gate electrode constituted by a polysilicon film on each of said nitrified first oxide film and said second oxide film;

forming diffusion layers prospectively serving as a source and a drain in areas of said semiconductor substrate lying in predetermined relation with said gate electrode;

forming an insulating interlayer formed on said oxide film and said nitrified first oxide film including said gate electrode;

forming contact holes in said insulting interlayer on said diffusion layers and forming wiring electrodes on said insulating interlayer; and forming a covering insulating film serving as a protection film on said insulating interlayer including said wiring electrodes.

5. A method of manufacturing a semiconductor device, comprising the steps of:

forming an element region and an element isolation region on said semiconductor substrate of the first conductivity type;

forming a first oxide film prospectively serving as a gate insulating film in said element region;

removing a part of said first oxide film and forming a second oxide film prospectively serving as a gate insulating film;

performing thermal oxidation after annealing is performed in a nitrogen or ammonia atmosphere to nitrify an entire surface of the resultant structure;

removing a portion of said nitrified first oxide film and forming a third oxide film prospectively serving as a gate insulating film using said nitrified first oxide film and a nitrified second oxide film as masks; and forming said gate electrode constituted by a polysilicon film.

6. A method according to claim 5, wherein said first, second, and third oxide films are formed by a photoetching technique.

7. A method according to claim 5, wherein the portion of said nitrified first oxide film is removed by a photoetching technique.

8. A method of manufacturing a semiconductor device, comprising the steps of:

forming an element region and an element isolation region on a semiconductor substrate of a first conductivity type;

forming a first oxide film prospectively serving as a gate insulating film in said element region;

forming a first polysilicon film prospectively serving as a floating gate electrode in a predetermined region of said first oxide film;

forming a second oxide film on said first polysilicon film and performing thermal oxidation after annealing is performed in a nitrogen or ammonia atmosphere to nitrify an entire surface of the resultant structure;

removing a portion of the nitrified first oxide film and forming a third oxide film prospectively serving as a gate insulating film using a nitrified second oxide film as a mask; and forming a gate electrode constituted by a second silicon film on each of the nitrified second oxide film and the third oxide film.

9. A method according to claim 8, wherein said first, second, and third oxide films are formed by a thermal oxidation method.

10. A method according to claim 8, wherein the portion of said nitrified first oxide film is removed by a photoetching technique.

11. A method of manufacturing a semiconductor device, comprising the steps of:

forming an element region and an element isolation region on a semiconductor substrate of a first conductivity type;

forming a first oxide film prospectively serving as a gate insulating film in said element region;

forming a diffusion layer having a conductivity type opposite to the first conductivity type of said semiconductor substrate in a subregion of said element region;

removing a part of said first oxide film on said diffusion layer and forming a second oxide film;

performing thermal oxidation after annealing is performed in a nitrogen or ammonia atmosphere to nitrify an entire surface of the resultant structure;

forming a first polysilicon film prospectively serving as a floating gate on the nitrified first oxide film including a nitrified second oxide film;

forming a third oxide film on said first polysilicon film and performing thermal oxidation after annealing is performed in a nitrogen or ammonia atmosphere to nitrify an entire surface of the resultant structure;

removing a portion of the nitrified first oxide film and forming a fourth oxide film prospectively serving as a gate insulating film in the removed portion using a nitrified third oxide film as a mask; and forming a gate electrode constituted by a second silicon film on each of the nitrified third oxide film and the fourth oxide film.

12. A method according to claim 11, wherein said first, second, third, and fourth oxide films are formed by a thermal oxidation method.

13. A method according to claim 11, wherein the portion of said nitrified first oxide film is removed by a photoetching technique.

* * * * *